US006567483B1

(12) United States Patent
Dent et al.

(10) Patent No.: US 6,567,483 B1
(45) Date of Patent: May 20, 2003

(54) MATCHED FILTER USING TIME-MULTIPLEXED PRECOMBINATIONS

(75) Inventors: Paul W. Dent, Pittsboro, NC (US); Clarence V. Roberts, Raleigh, NC (US)

(73) Assignee: Ericsson, Inc., Research Triangle Park, NC (US)

( * ) Notice: Subject to any disclaimer, the term of this patent is extended or adjusted under 35 U.S.C. 154(b) by 0 days.

(21) Appl. No.: 09/345,409

(22) Filed: Jul. 1, 1999

Related U.S. Application Data

(63) Continuation-in-part of application No. 09/197,597, filed on Nov. 23, 1998, which is a continuation-in-part of application No. 08/967,444, filed on Nov. 11, 1997, application No. 09/345,409, which is a continuation-in-part of application No. 09/343,468, filed on Jun. 30, 1999, now Pat. No. 6,366,938, which is a continuation-in-part of application No. 08/967,444, filed on Nov. 11, 1997, now Pat. No. 5,931,893.

(51) Int. Cl.[7] ............................. H03D 1/00; H03L 27/06
(52) U.S. Cl. ........................ 375/343; 375/150; 708/422
(58) Field of Search ................................ 375/142, 143, 375/150, 151, 152, 153, 343; 708/422, 423, 424, 425, 426

(56) References Cited

U.S. PATENT DOCUMENTS

| 4,660,164 A | | 4/1987 | Leibowitz ................... 364/728 |
| 5,684,727 A | * | 11/1997 | Campbell et al. ........... 708/422 |
| 5,715,276 A | * | 2/1998 | Tran et al. ................... 375/152 |
| 5,764,691 A | * | 6/1998 | Hennedy et al. ............. 375/207 |
| 6,130,906 A | * | 10/2000 | Davidovici et al. ......... 375/152 |

FOREIGN PATENT DOCUMENTS

WO        WO 00/31659        6/2000

* cited by examiner

*Primary Examiner*—Phuong Phu
(74) *Attorney, Agent, or Firm*—Moore & Van Allen, PLLC; Gregory Stephens

(57) ABSTRACT

A technique for correlating a stream of signal sample values with a predetermined binary code having a plurality of binary code bits is disclosed. The technique is realized by forming precombinations of groups of the signal sample values in the stream, and then temporally ordering the precombinations. Particular ones of the temporally ordered precombinations are selected based upon particular combinations of the plurality of binary code bits. The particular selected ones of the temporally ordered precombinations are then combined to form a correlation.

30 Claims, 4 Drawing Sheets

MATCHED FILTER USING TIME-MULTIPLEXED PRECOMBINATIONS

CROSS-REFERENCE TO RELATED APPLICATIONS

This patent application is a continuation-in-part patent application of U.S. patent application Ser. No. 09/197,597, entitled "Reduced Power Matched Filter", filed Nov. 23, 1998, which is a continuation-in-part patent application of U.S. patent application Ser. No. 08/967,444, entitled "Efficient Correlation Over a Sliding Window", filed Nov. 11, 1997, both of which are hereby incorporated by reference herein in their entirety.

This patent application is also a continuation-in-part patent application of U.S. patent application Ser. No. 09/343,468 file date Jun. 30, 1999, now issued U.S. Pat. No. 6,366,938, entitled "Reduced Power Matched Filter Using Precomputation", which is also a continuation-in-part patent application of the above-referenced U.S. patent application Ser. No. 08/967,4441 file date Nov. 11, 1997, now issued U.S. Pat. No. 5,931,893, and which is also hereby incorporated by reference herein in its entirety.

This patent application is also a continuation-in-part patent application of U.S. patent application Ser. No. 09/286,503, entitled "Complex Matched Filter with Reduced Power Consumption", filed Apr. 6, 1999, which is a continuation-in-part patent application of U.S. patent application Ser. No. 08/748,755, entitled "Despreading of Direct Sequence Spread Spectrum Communications Signals", filed Nov. 14, 1996, both of which are hereby incorporated by reference herein in their entirety.

FIELD OF THE INVENTION

The present invention relates generally to matched filters for digitally coded signals and, more particularly, to a matched filter using time-multiplexed precombinations to reduce power consumption in radio receivers of Code Division Multiple Access (CDMA) signals.

BACKGROUND OF THE INVENTION

The cellular telephone industry has made phenomenal strides in commercial operations in the United States as well as the rest of the world. Growth in major metropolitan areas has far exceeded expectations and is outstripping system capacity. If this trend continues, the effects of rapid growth will soon reach even the smallest markets. Innovative solutions are required to meet these increasing capacity needs as well as maintain high quality service and avoid rising prices.

Throughout the world, one important step in cellular systems is to change from analog to digital transmission. Equally important is the choice of an effective digital transmission scheme for implementing the next generation of cellular technology. Furthermore, it is widely believed that the first generation of Personal Communication Networks (PCNs) employing low cost, pocket-size, cordless telephones that can be carried comfortably and used to make or receive calls in the home, office, street, car, etc. will be provided by cellular carriers using the next generation of digital cellular system infrastructure and cellular frequencies. The key feature demanded of these new systems is increased traffic capacity.

Currently, channel access is achieved using Frequency Division Multiple Access (FDMA), Time Division Multiple Access (TDMA), and Code Division Multiple Access (CDMA) methods. In FDMA systems, a communication channel is a single radio frequency band into which a signal's transmission power is concentrated. Interference with adjacent channels is limited by the use of bandpass filters that only pass signal energy within the filters' specified frequency bands. Thus, with each channel being assigned a different frequency, system capacity is limited by the available frequencies as well as by limitations imposed by channel reuse.

In TDMA systems, a channel consists of a time slot in a periodic train of time intervals over the same frequency. Each period of time slots is called a frame. A given signal's energy is confined to one of these time slots. Adjacent channel interference is limited by the use of a time gate or other synchronization element that only passes signal energy received at the proper time. Thus, the problem of interference from different relative signal strength levels is reduced.

Capacity in a TDMA system is increased by compressing the transmission signal into a shorter time slot. As a result, the information must be transmitted at a correspondingly faster burst rate that increases the amount of occupied spectrum proportionally.

With FDMA or TDMA systems or hybrid FDMA/TDMA systems, the goal is to ensure that two potentially interfering signals do not occupy the same frequency at the same time. In contrast, CDMA systems allow signals to overlap in both time and frequency. Thus, all CDMA signals share the same frequency spectrum. In both the frequency and the time domain, the multiple access signals overlap. Various aspects of CDMA communications are described, for example, in "On the Capacity of a Cellular CDMA System," by Gilhousen, Jacobs, Viterbi, Weaver and Wheatley, *IEEE Trans. On Vehicular Technology,* May 1991.

In a typical CDMA system, the informational data stream to be transmitted is impressed upon a much higher bit rate data stream generated by a pseudo-random noise code (PNcode) generator. The informational data stream and the higher bit rate code data stream are typically multiplied together. This combination of the lower bit rate informational data stream with the higher bit rate code data stream is called coding or spreading the informational data stream signal. Each informational data stream or channel is allocated a unique spreading code. A plurality of coded information signals are transmitted on radio frequency carrier waves and jointly received as a composite signal at a receiver. Each of the coded signals overlaps all of the other coded signals, as well as noise-related signals, in both frequency and time. By correlating the composite signal with one of the unique spreading codes, the corresponding information signal is isolated and decoded.

There are a number of advantages associated with CDMA communication techniques. The capacity limits of CDMA-based cellular systems are projected to be up to twenty times that of existing analog technology as a result of the wideband CDMA system's properties such as improved coding gain/modulation density, voice activity gating, sectorization and reuse of the same spectrum in every cell. CDMA is virtually immune to multi-path interference, and eliminates fading and static to enhance performance in urban areas. CDMA transmission of voice by a high bit rate encoder ensures superior, realistic voice quality. CDMA also provides for variable data rates allowing many different grades of voice quality to be offered. The scrambled signal format of CDMA eliminates cross-talk and makes it very difficult and costly to eavesdrop or track calls, insuring greater privacy for callers and greater immunity from air-time fraud. In communication systems following the CDMA or "spread spectrum" concept, the frequency spectrum of an informational data stream is spread using a code uncorrelated with that of the data signals. The codes are also unique to every user. This is the reason why a receiver that has knowledge about the code of the intended transmitter is capable of selecting the desired signal.

There are several different techniques to spread a signal. Two of the most popular are Direct-Sequence (DS) and Frequency-Hopping (FH), both of which are well known in the art. According to the DS technique, the data signal is multiplied by an uncorrelated pseudo-random code (i.e., the previously described PNcode). The PNcode is a sequence of chips (bits) valued at −1 and 1 (polar) or 0 and 1 (non-polar) and has noise like properties. One way to create a PNcode is by means of at least one shift register. When the length of such a shift register is N, the period, $T_{DS}$, is given by the equation $T_{DS}=2^N-1$.

In a receiver in a CDMA system, the received signal is multiplied again by the same (synchronized) PNcode. Since the code consists of +1's and −1's (polar), this operation removes the code from the signal and the original data signal is left. In other words, the despreading operation is the same as the spreading operation.

Referring to FIG. 1, there is shown a schematic diagram of a prior art correlator 10 which is used to compute correlations between the last M signal samples received and an M-bit codeword. An M-element delay line 11 stores received signal samples and sequentially shifts them through each of the M stages. Consequently, the delay line memory elements contain the last M signal sample values received. After each new signal sample is shifted in and each old signal sample is shifted out, the M signal sample values are read out of the delay line into M sign-changers 13, where the M signal sample values are multiplied by +1 or −1 according to the bits $b_1 \ldots b_M$ of a predetermined code stored in code store 12 with which correlation is to be computed. The sign-changed values are then summed in adder 14 to produce a correlation result.

In general, the process of correlating an M-element vector A=(a1, a2 ... aM) with an M-element vector B =(b1,b2 ... bM) involves forming the inner product A·B=a1·b1+a2·b2+ .... aM·bM. When the elements of one of the vectors (e.g., B) comprises only binary values (arithmetically +1 or −1), the products such as a1·b1 simplify to ±a1, but the process of adding the M values ±a1,±a2 .... ±aM is still a significant effort when it has to be performed for every new value of "a" received.

The prior art includes many variations of the correlator 10 shown in FIG. 1. For example, signal samples may be single-bit or "hard-limited" quantities of only ±1 or −1 instead of multi-bit quantities. The sign-changers 13 used then are typically simple XOR gates. In that case, the adder 14 may first add pairs of single-bit values to obtain M/2 two-bit values; M/4 two-bit adders then add two-bit values to obtain M/4 three-bit values, and so on. Such a structure, known as an "adder tree", is simpler when the input values are single-bit rather than multi-bit values.

For single-bit value signal samples, the adder tree can be replaced by an up/down counter that scans the M values, and counts up when a +1 is encountered and down when a −1 is encountered. Likewise, for multi-bit value signal samples, a parallel adder tree can be replaced by a sequential adder that extracts each of the M values, in turn, from the delay line memory and adds it to an accumulator. In the latter case, the logic employed must operate M-times as fast as in the parallel adder case. Consequently, there is a trade-off between the overall speed of the correlator and the logic complexity. Nevertheless, in each of the above-described prior art correlator variations, it is necessary to combine M values anew after each new signal sample is received. This can result in large amounts of power being consumed, particularly when the power supply is a portable supply such as a battery.

Referring to FIG. 2, there is shown a schematic diagram of another prior art correlator 20, this one having an address counter 21, a switch matrix 22, a plurality of stores 23, a corresponding plurality of sign-changers 24, and an adder tree 25. Each new signal sample, S(i), is input to a first stage 22a of the switch matrix 22 that is controlled by the address counter 21 to steer the input value of the signal sample to the next available one of stores 23, which will be the store that was last used "n" samples previously to store sample S(i−n). Sample S(i−n) is thus overwritten by the new sample S(i). The purpose of the switch matrix 22 is to connect the input sample lines only to the store selected by the address counter 21 in order to reduce the capacitive loading on the input lines, and thereby reduce power consumption when operating at a high sample rate. The first stage 22a of the switch matrix 22 is controlled by a first bit of the address counter 21 to steer the input value either to a first of the second stage switches 22b or to a second of the second stage switches 22b. A second bit of the address counter 21 operates the second stage switches to steer the input value to one of four third stage switches 22c, and so forth, until a final stage of switches 22d steers the input value to a unique one of stores 23. The first address counter bit used to control switch 22a is preferably the most rapidly changing address counter bit, while the more numerous switches in the final stage of switches 22d are preferably controlled by the most slowly varying bit of the address counter 21, thereby minimizing the power consumption associated with toggling switches. By this means, the stores 23 memorize the last "n" input sample values, where "n" is a power of two in this example. Of course, "n" can also be less than a power of two and the address counter 21 can be arranged to count from 0 to n−1 and then reset to zero. Since only one store value is modified at each sample clock instant, the power consumption of this arrangement is much lower than shifting the input values through an "n"-stage shift register, where all "n" values would change at each sample clock instant, such as in the correlator 10 of FIG. 1. The difference is that, in the shift register case, the first register always contains the most recent signal sample, S(i). In the correlator 20 of FIG. 2, however, the store that contains the most recent signal sample, S(i), rotates cyclically as "i" increments, but is nevertheless indicated by the value of the address counter 21.

The correlation to be computed is given by the expression, $$Cn \cdot S(i)+C(n-1) \cdot S(i-1)+C(n-2) \cdot S(i-2) \ldots +C(1) \cdot S(i-n+1) \quad (1)$$

where (C1,C2,C3 ... C(n)) is an n-bit code with each code bit having a value of +1 or −1. Multiplications by +1 or −1 are simply performed by either changing the sign (for −1) or not (for +1) using the sign-changers 24 controlled by the respective. code bit. The code bits are supplied by a code generator (not shown) that must rotate the code such that Cn is applied to the multiplier in the sign-changer 24 that is connected to the store 23 containing the most recent signal sample S(i), which is indicated by the address counter 21. Since the code comprises single bit values, it is preferable to rotate the code rather than rotate the contents of stores 23, which hold multi-bit signal samples.

The sign-changed outputs from the sign-changer 24 are added in the adder tree 25, which adds pairs at a time. The number of stages of the adder tree 25 that are required to produce the final correlation value output is the same as the number of switch stages 22a . . . 22d needed to address a unique one of stores 23 (i.e., $LOG_2$ (n) stages). Thus, a 64-bit correlator comprises sixty-four stores 23, six stages of input steering switches 22, and six stages of adder tree 25 totaling 32+16+8+4+2+1=63 adders.

Although the input steering arrangement in the correlator 20 of FIG. 2 gives significant power economies compared to a shift register, the number of additions per correlation value computed is still equal to 63. That is, the number of additions has not been reduced through the use of the correlator 20 of FIG. 2. Thus, similar to the correlator 10 of FIG. 1, the number of additions required in the correlator 20 of FIG. 2 can result in large amounts of power being consumed, particularly when the power supply is a portable supply such as a battery.

In view of the foregoing, it would be desirable to provide a matched filter that minimizes computations so as to reduce power consumption.

SUMMARY OF THE INVENTION

According to the present invention, a technique for correlating a stream of signal sample values with a predetermined binary code having a plurality of binary code bits is provided. In one embodiment, the technique is realized by-forming precombinations of groups of the signal sample values in the stream, and then temporally ordering the precombinations. The number of precombinations formed is typically equal to two to the power of the number of signal sample values in the groups of signal sample values. However, the number of precombinations formed can also be equal to two to the power of the number of signal sample values in the groups of signal sample values divided by two, or a multitude of other numbers. Regardless, the precombinations are preferably temporally ordered into timeslots over a distribution bus.

Particular ones of the temporally ordered precombinations are selected based upon particular combinations of the plurality of binary code bits. For example, each of the particular ones of the temporally ordered precombinations may be selected by decoding a corresponding group of the plurality of binary code bits. The group of the plurality of binary code bits is preferably decoded by a gate or latch, which then passes a particular selected one of the temporally ordered precombinations.

The particular selected ones of the temporally ordered precombinations are combined to form a correlation. The particular selected ones of the temporally ordered precombinations are preferably combined by arithmetic combining circuits, which typically include sign changers for changing the sign of the selected ones of the temporally ordered precombinations based upon the values of particular ones of the plurality of binary code bits.

In accordance with other aspects of the present invention, the arithmetic combining circuits may combine the particular selected ones of the temporally ordered precombinations with delayed partial sums to obtain undelayed partial sums. Delay elements may be used to delay the undelayed partial sums to produce the delayed partial sums. The delay elements are preferably divided into a number of separately clocked banks of delay elements. For example, if the stream of signal sample values are presented at a rate determined by a sample rate clock of a particular frequency, each bank of delay elements is preferably clocked with a respective phase of a multiphase clock derived by dividing the particular frequency of the sample rate clock by the number of banks. The number of banks of delay elements is preferably equal to the number of signal sample values in the groups of signal sample values.

In accordance with further aspects of the present invention, the stream of signal sample values, as well as the plurality of predetermined binary code bits, may be in real or complex form. If the stream of signal sample values and the plurality of predetermined binary code bits are in complex form, precombinations of subgroups of groups of real and imaginary parts of the complex signal sample values are formed. The precombinations are temporally ordered and then selected based upon particular combinations of the plurality of complex binary code bits. A first half of the selected temporally ordered precombinations are combined to form a real part of a complex correlation, and a second half of the selected temporally ordered precombinations are combined to form an imaginary part of the complex correlation. The arithmetic combining circuits that are typically used to combine the selected temporally ordered precombinations are preferably time-shared to combine the first half of the selected temporally ordered precombinations at given time instants, and to combine the second half of the selected temporally ordered precombinations at intervening time instants.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

DETAILED DESCRIPTION OF A PREFERRED EMBODIMENT

Figure 1:
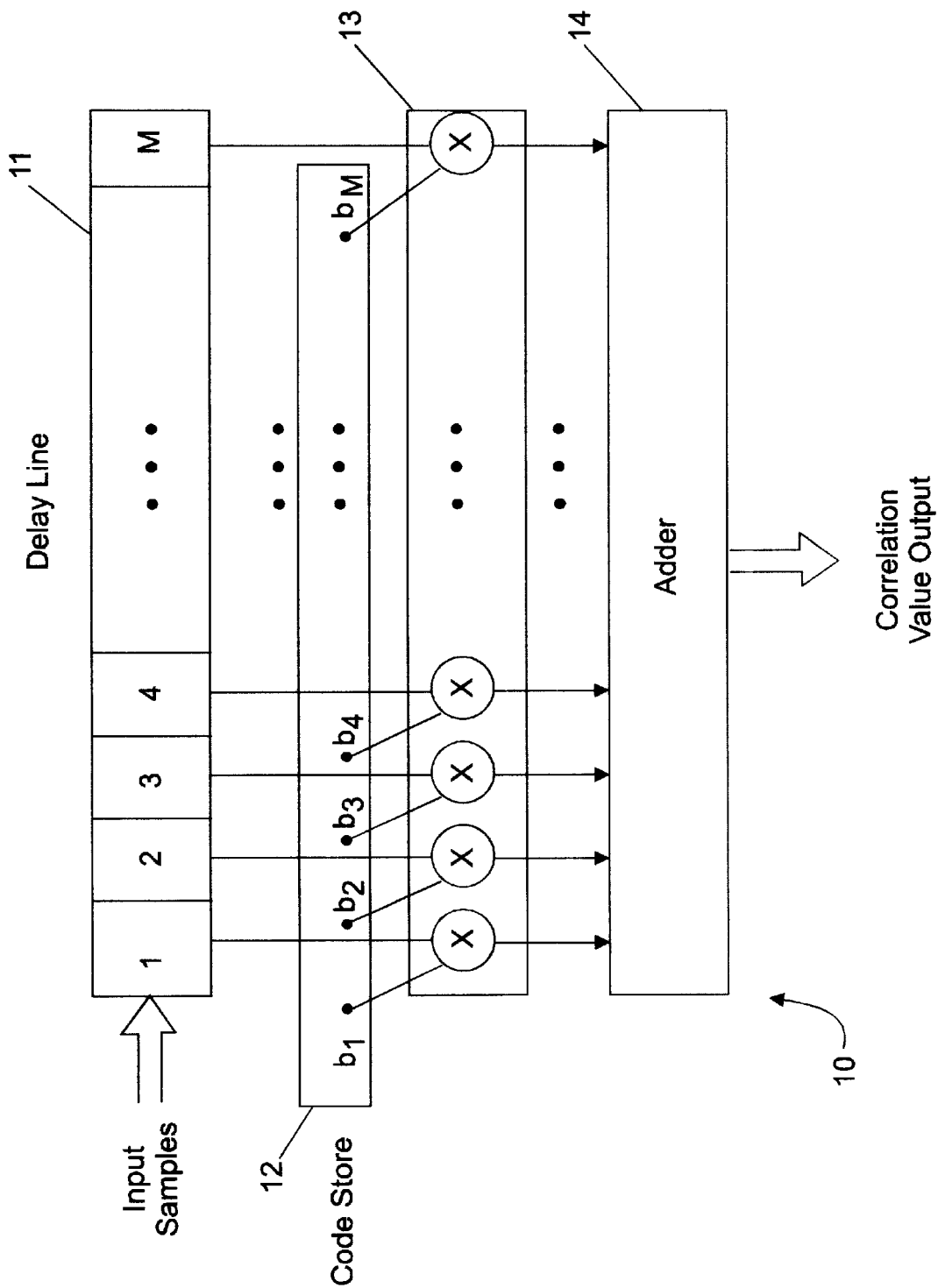
FIG. 1 is a schematic diagram of a first prior art correlator that does not compute precombinations.
Figure 2A:
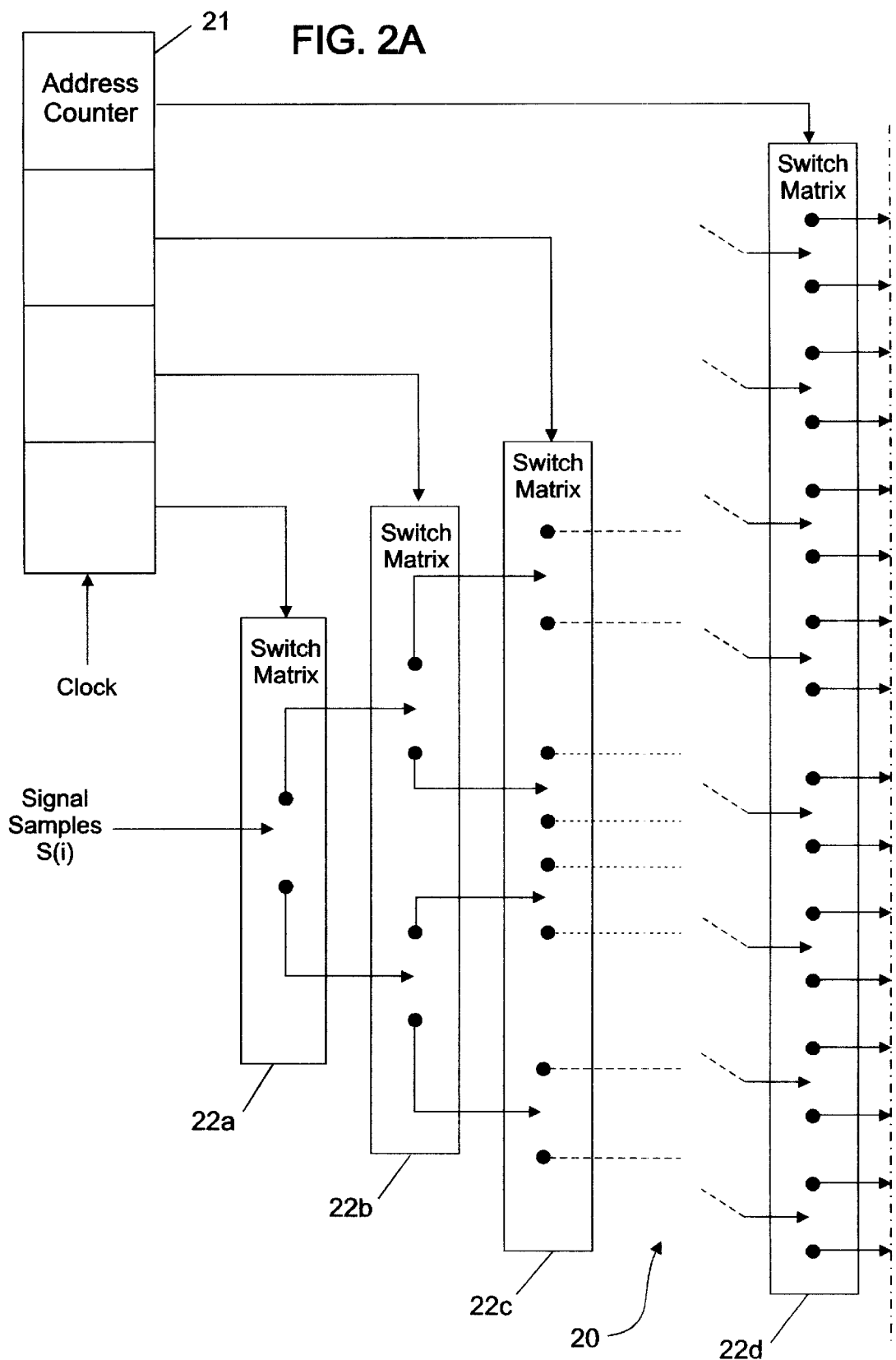
FIG. 2 is schematic diagram of a second prior art correlator that does not compute precombinations.
Figure 2B:
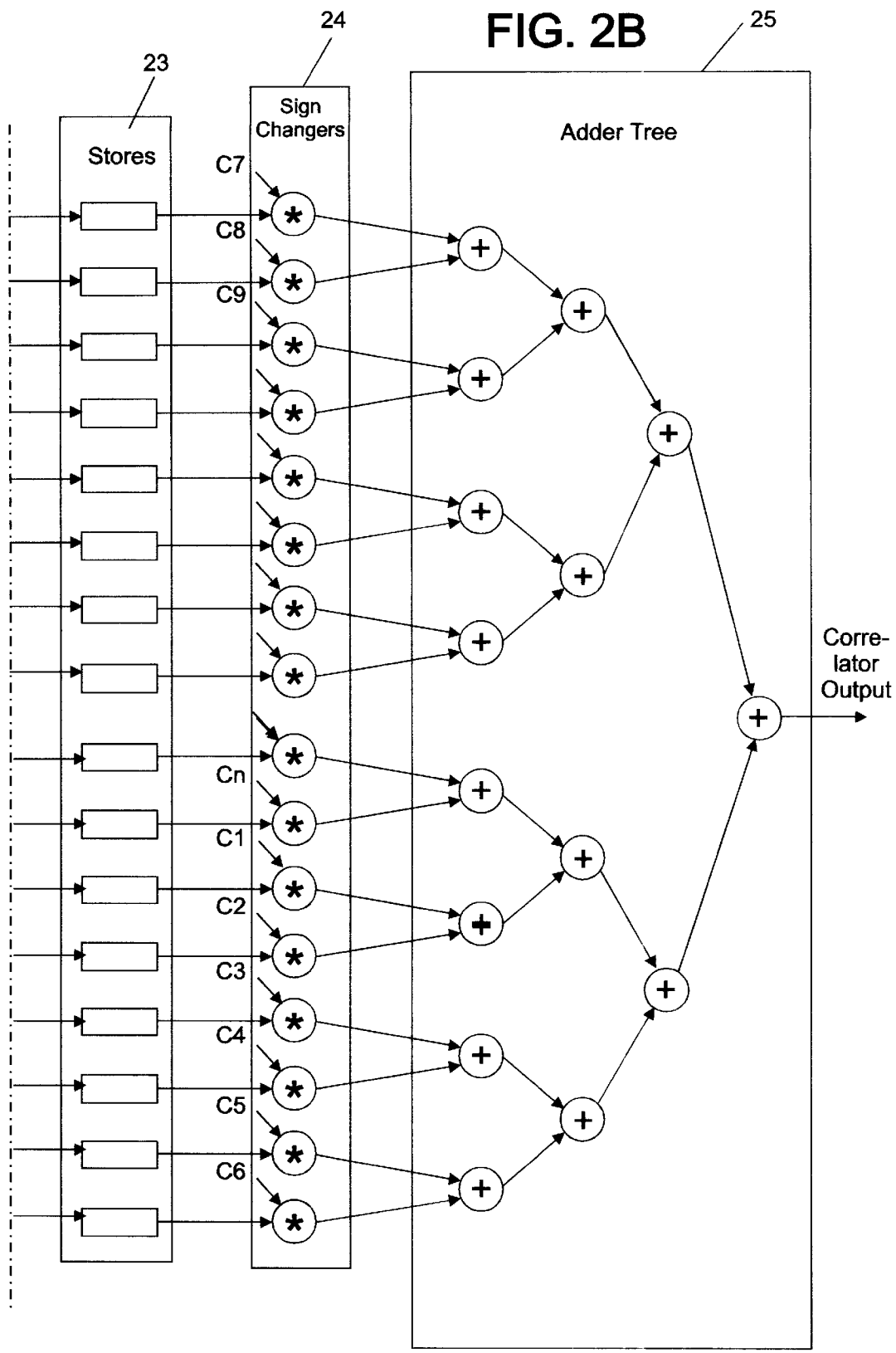
Figure 3:
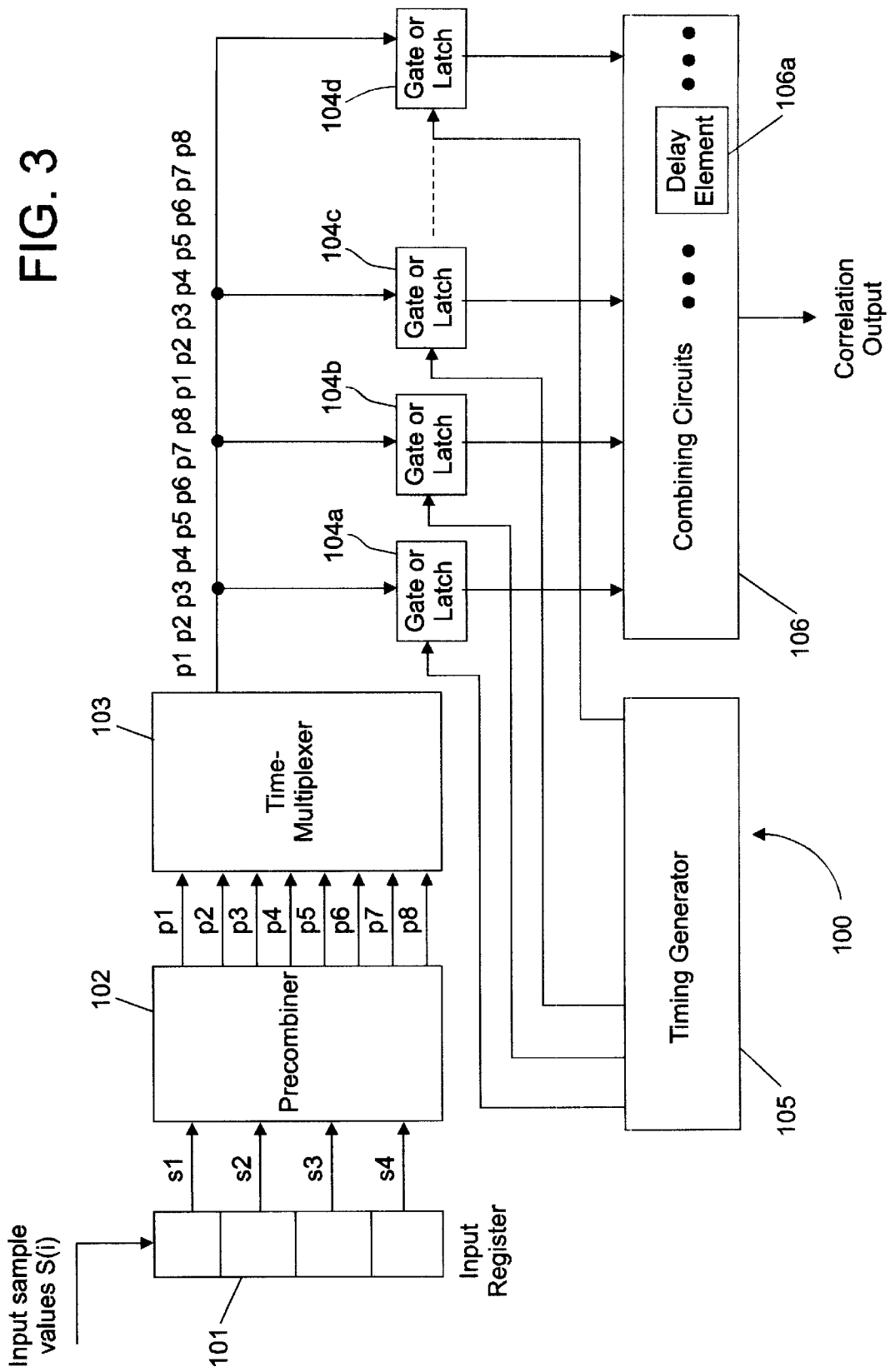
FIG. 3 is a schematic diagram of a correlator that time-multiplexes precombinations of signal sample values in accordance with the present invention.

Referring to FIG. 3, there is shown a correlator 100 that time-multiplexes precombinations of signal sample values in accordance with the present invention. The correlator 100 comprises an input register 101, a precombiner 102, a time multiplexer 103, a plurality of time-gates, or latches, 104, a timing generator 105, and combining circuits 106.

The input register 101, which in this example is a 4-stage input register, sequentially receives signal sample values, S(i), which may be real or complex values. Thus, input register 101 contains the last four signal sample values received, wherein S1=S(i), S2=S(i−1), S3=S(i−2), and S4=S(i−3).

The input register 101 provides the four signal sample values (i.e., S1, S2, S3, and S4) to the precombiner 102, which forms precombinations of the four signal sample values. Assuming that the four signal samples values are real values, there are sixteen possible combinations of + and − signs that can be applied to combine the four signal sample values. However, half of the combinations are just the negatives of the other half, so only eight need be formed. A technique for forming these precombinations using only one addition per combination, by a Grey-code ordering of the patterns of + and − signs, is described in previously referenced U.S. patent application Ser. No. 08/967,444, which is incorporated by reference herein.

Alternatively, the four signal sample values could be complex. For example, S(i) could be the real part of a first complex signal sample value and S(I−1) could be the imaginary part of the first complex signal sample value. Likewise, S(i−2) and S(i−3) could be the real and imaginary parts of a second complex signal sample value. It is known that complex signals can be represented by time-multiplexing the real and imaginary parts alternately on a single line or bus. Further, a complex correlator using precombinations of two complex signal sample values (four real values) requires eight precombinations, as shown in previously referenced U.S. patent application Ser. No. 09/343,468, now issued U.S. Pat. No. 6,366,938, which is incorporated by reference herein. Thus, the correlator 100 of FIG. 3 is also operative for two complex signal sample values (four real values).

The precombinations formed by the precombiner 102, denoted by p1,p2 . . . p8 in the exemplary case of 8 precombinations, are time-multiplexed onto a single output line or bus by the time multiplexer 103. Although FIG. 3 shows a specific time multiplexer 103 for time-multiplexing the precombinations p1,p2 . . . p8 such that they appear sequentially in a known order at the output of the time multiplexer 103, persons skilled in the art will realize that the precombiner 102 and the time-multiplexer 103 could be combined by having the precombiner 102 compute and output each separate precombination in a sequential time order. For example, the precombiner 102 could compute and output p1, then compute and output p2 . . . . etc.

In previously referenced U.S. patent application Ser. No. 08/967,444, now issued U.S. Pat. No. 5,931,893, and previously referenced U.S. patent application Ser. No. 09/343, 468, how issued U.S. Pat. No. 6,366,938, which are both incorporated by reference herein, certain ones of the precombinations p1, p2 . . . p8 would now be selected for further combination in the combining circuits 106 to obtain a complete 64-sample correlation. For example, if the precombiner 102 combines four real signal sample values together at a time, then 16 of the four-sample value precombinations must be selected and further combined in the combining circuits 106 to form a 64-sample correlation. Thus, the combining circuits 106 have ¼ the complexity of prior art correlators for real signal sample values. In a complex correlator example, if the precombiner 102 forms precombinations of the real or imaginary parts of two successive complex signal sample values, then the combining circuits 106 only need to compute 32 further combinations of selected precombinations to obtain a real correlation value and 32 further combinations of selected precombinations to obtain an imaginary correlation value. As in the real signal sample case, the combining circuits 106 have only ¼ the complexity of prior art 64-sample complex correlators, which need to form four, 64-sample real correlations. Part of this factor of four improvement over the prior art corresponds to the teachings in previously referenced U.S. patent application Ser. No. 08/748,755, and previously referenced U.S. patent application No. 09/286,503, both of which are incorporated by reference herein. The other part of the factor of four improvement over the prior art is obtained by the precombination of pairs of complex signal samples.

In accordance with the present invention, precombinations are selected for further combining in the combining circuits 106 by time-gating the precombinations using the plurality of time-gates, or latches, 104 and the timing generator 106. That is, the timing generator 105 generates timing signals for each of the time-gates 104 so as to allow precombinations, which are present on the time-multiplexed output bus of the time-multiplexer 103, to pass through the time-gates 104 and to the combining circuits 106. In the exemplary case of the 8 precombinations, p1,p2 . . . p8, these 8 precombinations are time-multiplexed into an 8-slot time division multiplexing (TDM) frame format, that in one implementation repeats at the input sample rate (complex sample rate for complex samples, i.e., for every two real values input). During each time-slot, the timing generator 105 generates a gating or latching pulse for a corresponding time-gate 104. Thus, the timing generator 105 preferably has access to an 8× sample-rate clock. The time-slot during which each gate/latch pulse is generated in a function of subgroups of bits of the code against which the signal samples are being correlated, as described in previously referenced U.S. patent application Ser. No. 09/197,597, previously referenced U.S. patent application Ser. No. 09/343,468, now issued U.S. Pat. No. 6,366,938, and previously referenced U.S. patent application Ser. No. 08/967, 444, now issued U.S. Pat. No. 5,931,893, all of which are incorporated by reference herein.

As different precombinations are not present on the bus at the same time, but are required to be combined together, the selected precombinations are preferably latched in a holding register so that they can be presented at the same time to the combining circuits 106. For operation at the maximum possible speed, double-buffering may be required so that latched precombinations can be transferred to a second holding register where they will stay for one whole sample period to provide the combining circuits 104 with time for carry-ripple and the like. Alternatively, the combining circuits 106 can be constructed using fast logic that can perform combinations during ⅛ of a sample clock period. The fast logic would preferably only use power during this ⅛ of the sample clock period and be powered down for the rest of the sample clock period. For example, using a so-called BiCMOS silicon chip fabrication process, the fast logic can be Bipolar Emitter Coupled Logic (ECL) which operates by steering current from current sources to one or another output of a gate to represent a binary zero or one. Thus, current sources may be disabled except during the ⅛ of the sample clock period, or for only the time during which the logic must operate. This is a most power-efficient way to combine CMOS logic and Bipolar logic in a single chip using a BiCMOS process.

The combining circuits 106 can take on one of a number of forms, some of which are described in previously referenced U.S. patent application Ser. No. 09/343,468, now issued U.S. Pat. No. 6,366,938, previously referenced U.S. patent application Ser. No. 09/197,597, and previously referenced U.S. patent application Ser. No. 08/967,444, now issued U.S. Pat. No. 5,931,893, all of which are incorporated by reference herein. For example, the combining circuits 106 can be an adder tree as described in previously referenced U.S. patent application Ser. No. 09/343,468, now issued U.S. Pat. No. 6,366,938. In that particular application, when +/− symmetry has been used to halve the number of precombinations formed, the final sign is first applied to selected precombinations using selected bits of the code against which the signal samples are being correlated. The sign-changed selected precombinations are then simply added using an adder tree, such as a binary adder tree, which combines pairs, then pairs of combined pairs, and so, forth.

For a complex correlator, the adder tree comprises a first adder tree for forming the real part of a desired correlation, and a second adder tree for forming the imaginary part of a desired correlation. Alternatively, the same adder tree can be used for both the real part and the imaginary part by first selecting as its inputs the precombinations that have to be further combined to form the real part of the correlation result, and then selecting as its inputs the precombinations that have to be further combined to form the imaginary part of the correlation results.

Alternatively, the combining circuits 106 can be of the sequential combining type, such as described in previously referenced U.S. patent application Ser. No. 09/197,597. In that particular application, a first selected and sign-changed precombination is delayed one sample period and added to a second selected and sign-changed precombination, the result then being further delayed and added to a third selected and sign-changed precombination. At each stage, the contents of the delay elements represent partial sums for a future, complete correlation, while the output of the final adder is the current, complete correlation. Thus, the combining circuits 106 in the correlator 100 of FIG. 3 may comprise delay or memory elements 106a for delaying precombinations or sums thereof.

For a complex correlator, half of the time-gates, or latches, 104 can select precombinations that are to be further combined to form the real part of a desired correlation, while the other half of the time-gates, or latches, 104 can select precombinations that are to be further combined to form the imaginary part of a desired correlation. As described in previously referenced U.S. patent application Ser. No. 09/197,597, sequential combining circuits can be advantageously split into separate combining circuits that operate to a particular phase of a sub-sample-rate clock. For example, in a real correlator that precombines groups of four real values together, the combining circuits 106 would comprise four sets of combining circuits, each for combining 16 values, and each operating only ¼ of the time. That is, a first combining circuit would operate for sample clock instants 1,5,9,13 . . . , a second combining circuit would operate for sample clock instants 2,6,10,14 . . . , and so forth.

At this point it should be noted that, as described in previously referenced U.S. patent application Ser. No. 08/967,444, the formation of precombinations may be reduced from once per sample period to once per four sample periods, or, in general, once per L sample periods if L-sample precombinations are formed. When this is done, every Lth correlation, e.g. correlation number nL, where n is an integer, may be calculated by further combining only precombinations of L samples. However, correlations numbered 4n+1 require a precombination of the three oldest samples in the correlation window and one new sample to be added, correlations numbered 4n+2 require a precombination of the two oldest samples in the correlation window and the two newest samples to be added, and correlations numbered 4n+3 require a precombination of the oldest sample in the correlation window and the three newest samples to be added to complete the starting and ending "fillets".

The correlator 100 can further improve upon the concept described in previously referenced U.S. patent application Ser. No. 08/967,444, if precombinations computed by precombiner 102 and time-multiplexed by time-multiplexer 103 include the starting and ending fillets. For example, a 64-sample real correlator that uses 8 precombinations of four real values $S(i)$, $S(i-1)$, $S(i-2)$ and $S(i-3)$ would also form and time multiplex the following precombinations:

$C64 \cdot S(i)$ $C64 \cdot S(i) + C63 \cdot S(i-1)$ $C64 \cdot S(i) + C63 \cdot S(i-1) + C62 \cdot S(i-2)$ and $C3 \cdot S(i) + C2 \cdot S(i-1) + C1 S(i-2)$ $C2 \cdot S(i) + C1 \cdot S(i-1)$ $C1 \cdot S(i)$ These 6 precombinations may be reduced to five by just using $S(i)$ in place of $C64 \cdot S(i)$ and $C1 \cdot S(i)$, the signs C64 and C1 being applied within the combining circuits 106. Thus, at the additional expense of forming and time-multiplexing 13 or 14 precombinations instead of only 8, the rate at which the precombinations have to be formed can be reduced by four, i.e. the precombinations are only updated when index "i" is a multiple of four. In between, the combining circuits 106 can compute four successive correlations from the formed precombinations, including the starting and ending fillets which are needed for the three correlations that do not fall on a four-sample boundary.

Thus, according to the present invention, any correlators that use selection among multiple pre-computed quantities, such as, for example, the correlators described in previously referenced U.S. patent application Ser. No. 09/343,468, now issued U.S. Pat. No. 6,366,938, previously referenced U.S. patent application Ser. No. 09/197,597, and previously referenced U.S. patent application Ser. No. 08/967,444, now issued U.S. Pat. No. 5,931,893, can be implemented by time-multiplexing the multiple pre-computed quantities onto a single line or bus followed by time-gating to select certain of the multiple pre-computed quantities form the bus, as an alternative to selection switches. An improvement in the form of reduced power consumption is typically realized through the use of the time-multiplexing and time-gating functions.

At this point it should be noted that, in some implementations, the use of multi-pole selection switches may still represent the best choice. The use of time-multiplexing and time-gating does not therefore automatically represent a best mode for implementing such correlators, as the choice typically depends upon the characteristics of the semiconductor fabrication process used to fabricate the correlator, on the desired speed or sample rate of the correlator, as well as other parameters of the correlator, which may be weighed by a person of ordinary skill in the art. It should also be noted that, although FIG. 3 is described in the context of the correlator 100 being entirely implemented with hardware, some, if not all, of the concepts of the present invention may be implemented by one or more computing devices which operate according to instructions of one or more software programs that are stored on, or transmitted over, some form of storage or transmission medium, respectively.

In view of the foregoing, it can be readily understood that an improved matched filter is disclosed for real or complex signal sample values. The improved matched filter receives at its input a stream of real or complex signal sample values, with one new sample value being received at each successive period of a sample rate clock. For each new sample input, a complete correlation value is output, the value of which is the correlation between the last N input samples and a given real or complex code word of N digital symbols. The improved matched filter computes the successive correlations at each new sample clock period in a manner requiring significantly fewer than N multiply-add operations per correlation value, by forming precombinations of a limited number of successive input samples, the precombinations being independent of the given N digital symbols. The precombinations are time-multiplexed and distributed by means of a bus to a number of combining circuits. Gating clocks are generated at times dependent upon a combination of the given N digital symbols to select from the bus certain precombinations which are further combined using the combining circuits.

In an exemplary implementation for correlating real values, a number L of successive input values are precombined to produce $2^{L-1}$ precombinations which are time-multiplexed onto a bus. A number N/L gating clocks are generated at times dependent upon a subgroup of L symbols of a given real code word, wherein each gating clock is used to select from the bus at the appropriate time one of the time-multiplexed precombinations which is further combined using combining circuits.

In an exemplary implementation for correlating complex values, eight precombinations of two successive complex input sample values Sr(i), Si(i) and Sr(i−1), Si(i−1) are formed as:

$$Sr(i)+Sr(i-1)$$

$$Sr(i)-Sr(i-1)$$

$$Si(i)+Si(i-1)$$

$$Si(i)-Si(i-1)$$

$$Sr(i)+Sr(i-1)$$

$$Sr(i)-Si(i-1)$$

$$Si(i)+Sr(i-1)$$

and $$Si(i)-Sr(i-1)$$

which are then time-multiplexed onto a bus. Gating clocks are generated at times depending upon given complex code bits Cr(2k), Cr(2k+1), Ci(2k), and Ci(2k+1), wherein each gating clock is used to select from the bus at the appropriate time one of the time-multiplexed precombinations which is further combined using combining circuits. The gating clock that is generated depending upon given complex code bits Cr(2k), Cr(2k+1), Ci(2k), and Ci(2k+1) is used to select a precombination to be further combined in combining circuit, k. The output from combining circuit number N/2−1 is an N-sample complex correlation, which therefore has been formed using only N/2−1 combining steps instead of the at least N−1 combing steps of the prior art.

The present invention is not to be limited in scope by the specific embodiments described herein. Indeed, various modifications of the present invention, in addition to those described herein, will be apparent to those of skill in the art from the foregoing description and accompanying drawings. Thus, such modifications are intended to fall within the scope of the appended claims.

What is claimed is:

1. A matched filter for correlating a stream of signal sample values with a predetermined binary code having a plurality of binary code bits, comprising:
   a precombiner for forming precombinations of groups of the signal sample values in the stream;
   a time-multiplexer for temporally ordering the precombinations;
   a plurality of gates for passing selected ones of the temporally ordered precombinations, the temporally ordered precombinations being selected based upon particular combinations of the plurality of binary code bits;
   arithmetic combining circuits for combining the selected ones of the temporally ordered precombinations with delayed partial sums to obtain undelayed partial sums; and
   delay elements to delay the undelayed partial sums to produce the delayed partial sums.

2. The matched filter of claim 1, wherein the precombinations are temporally ordered into timeslots over a distribution bus.

3. The matched filter of claim 1, wherein each of the plurality of gates is controlled by a group of the plurality of binary code bits.

4. The matched filter of claim 1, wherein the stream of signal sample values are presented at a rate determined by a sample rate clock of a particular frequency, wherein the delay elements are divided into a number of banks of delay elements, each bank being clocked with a respective phase of a multiphase clock derived by dividing the particular frequency of the sample rate clock by the number of banks.

5. The matched filter of claim 4, wherein the number of banks is equal to the number of signal sample values in the groups of signal sample values.

6. The matched filter of claim 1, wherein the number of precombinations formed is equal to two to the power of the number of signal sample values in the groups of signal sample values.

7. The matched filter of claim 1, wherein the number of precombinations formed is equal to two to the power of the number of signal sample values in the groups of signal sample values divided by two.

8. The matched filter of claim 1, wherein the arithmetic combining circuits include sign changers for changing the sign of the selected ones of the temporally ordered precombinations based upon the values of particular ones of the plurality of binary code bits.

9. A matched filter for correlating a stream of signal sample values with a predetermined binary code having a plurality of binary code bits, comprising:
   a precombiner for forming precombinations of groups of the signal sample values in the stream;
   a time-multiplexer for temporally ordering the precombinations;
   a plurality of gates for passing selected ones of the temporally ordered precombinations, the temporally ordered precombinations being selected based upon particular combinations of the plurality of binary code bits; and
   arithmetic combining circuits for combining the selected ones of the temporally ordered precombinations to form a correlation, wherein the arithmetic combining circuits include sign changers for changing the sign of the selected ones of the temporally ordered precombinations based upon the values of particular ones of the plurality of binary code bits.

10. The matched filter of claim 9, wherein the precombinations are temporally ordered into time-slots over a distribution bus.

11. The matched filter of claim 9, wherein each of the plurality of gates is controlled by a group of the plurality of binary code bits.

12. The matched filter of claim 9, wherein the arithmetic combining circuits include delay or memory elements.

13. The matched filter of claim 9, wherein the number of precombinations formed is equal to two to the power of the number of signal sample values in the groups of signal sample values.

14. A matched filter for correlating a stream of complex signal sample values with a predetermined complex binary code having a plurality of complex binary code bits, comprising:
- a precombiner for forming precombinations of subgroups of groups of real and imaginary parts of the complex signal sample values in the stream, wherein the number of precombinations formed is equal to two to the power of the number of signal sample values in the groups of signal sample values divided by two;
- a time-multiplexer for temporally ordering the precombinations;
- a plurality of gates for passing selected ones of the temporally ordered precombinations, the temporally ordered precombinations being selected based upon particular combinations of the plurality of binary code bits; and
- arithmetic combining circuits for combining a first half of the selected ones of the temporally ordered precombinations to form a real part of a complex correlation, and for combining a second half of the selected ones of the temporally ordered precombinations to form an imaginary part of the complex correlation.

15. The matched filter of claim 14, wherein the precombinations are temporally ordered into time-slots over a distribution bus.

16. The matched filter of claim 14, wherein each of the plurality of gates is controlled by a group of the plurality of complex binary code bits.

17. The matched filter of claim 14, wherein the arithmetic combining circuits include delay or memory elements.

18. The matched filter of claim 14, wherein the number of precombinations formed is equal to two to the power of the number of signal sample values in the groups of signal sample values.

19. The matched filter of claim 14, wherein the arithmetic combining circuits are time-shared to combine the first half of the selected ones of the temporally ordered precombinations at given time instants, and to combine the second half of the selected ones of the temporally ordered precombinations at intervening time instants.

20. The matched filter of claim 14, wherein the precombinations are temporally ordered into time-slots over a distribution bus.

21. The matched filter of claim 14, wherein each of the plurality of gates is controlled by a group of the plurality of complex binary code bits.

22. The matched filter of claim 14, wherein the arithmetic combining circuits include delay or momory elements.

23. The matched filter of claim 14, wherein the number of precombinations formed is equal to two to the power of the number of signal sample values in the groups of signal sample values.

24. The matched filter of claim 14, wherein the arithmetic combining circuits are time-shared to combine the first half of the selected ones of the temporally ordered precombinations at given time instants, and to combine the second half of the selected ones of the temporally ordered precombinations at intervening time instants.

25. A matched filter for correlating a stream of signal sample values with a predetermined binary code having a plurality of binary code bits, comprising:
- a precombiner for forming precombinations of groups of the signal sample values in the stream, wherein the number of precombinations formed is equal to two to the power of the number of signal sample values in the groups of signal sample values divided by two;
- a time-multiplexer for temporally ordering the precombinations;
- a plurality of gates for passing selected ones of the temporally ordered precombinations, the temporally ordered precombinations being selected based upon particular combinations of the plurality of binary code bits; and
- arithmetic combining circuits for combining the selected ones of the temporally ordered precombinations to form a correlation.

26. The matched filter of claim 25, wherein the precombinations are temporally ordered into time-slots over a distribution bus.

27. The matched filter of claim 25, wherein each of the plurality of gates is controlled by a group of the plurality of binary code bits.

28. The matched filter of claim 25, wherein the arithmetic combining circuits include delay or memory elements.

29. The matched filter of claim 25, wherein the number of precombinations formed is equal to two to the power of the number of signal sample values in the groups of signal sample values.

30. A matched filter for correlating a stream of complex signal sample values with a predetermined complex binary code having a plurality of complex binary code bits, comprising:
- a precombiner for forming precombinations of subgroups of groups of real and imaginary parts of the complex signal sample values in the stream;
- a time-multiplexer for temporally ordering the precombinations;
- a plurality of gates for passing selected ones of the temporally ordered precombinations, the temporally ordered precombinations being selected based upon particular combinations of the plurality of binary code bits; and
- arithmetic combining circuits for combining a first half of the selected ones of the temporally ordered precombinations to form a real part of a complex correlation, and for combining a second half of the selected ones of the temporally ordered precombinations to form an imaginary part of the complex correlation, wherein the arithmetic combining circuits include sign changers for changing the sign of the selected ones of the temporally ordered precombinations based upon the values of particular ones of the plurality of complex binary code bits.

* * * * *